United States Patent [19]
Wilson

[11] Patent Number: 5,661,089
[45] Date of Patent: Aug. 26, 1997

[54] METHOD FOR MAKING A SEMICONDUCTOR CHIP PACKAGE WITH ENHANCED THERMAL CONDUCTIVITY

[75] Inventor: James Warren Wilson, Vestal, N.Y.

[73] Assignee: International Business Machines Corporation, Armonk, N.Y.

[21] Appl. No.: 638,252

[22] Filed: Apr. 26, 1996

Related U.S. Application Data

[62] Division of Ser. No. 336,437, Nov. 9, 1994, Pat. No. 5,561,322.

[51] Int. Cl.$^6$ .................................................. H01L 21/60
[52] U.S. Cl. ........................... 438/125; 438/126; 29/832; 29/841
[58] Field of Search ..................... 437/209, 211, 437/214, 215, 217, 219, 220, 502, 218

[56] References Cited

U.S. PATENT DOCUMENTS

| | | | |
|---|---|---|---|
| 4,184,133 | 1/1980 | Gehle | 333/238 |
| 4,242,157 | 12/1980 | Gehle | 156/64 |
| 4,396,936 | 8/1983 | McIver et al. | 257/766 |
| 4,494,172 | 1/1985 | Leary et al. | 361/400 |
| 4,498,122 | 2/1985 | Rainal | 361/414 |
| 4,535,385 | 8/1985 | August et al. | 361/388 |
| 5,113,315 | 5/1992 | Capp et al. | 257/706 |
| 5,208,188 | 5/1993 | Newman | 437/220 |
| 5,243,133 | 9/1993 | Engle et al. | 174/52.4 |
| 5,401,689 | 3/1995 | Frei et al. | 437/220 |
| 5,406,120 | 4/1995 | Jones | 257/706 |
| 5,475,567 | 12/1995 | Hearn | 361/807 |
| 5,478,402 | 12/1995 | Hanoka | 437/219 |

FOREIGN PATENT DOCUMENTS

| | | | |
|---|---|---|---|
| 3152961 | 6/1991 | Japan | 257/706 |
| 582685 | 4/1993 | Japan | 257/206 |
| 582686 | 4/1993 | Japan | 257/706 |

OTHER PUBLICATIONS

IBM Technical Disclosure Bulletin (TDB), vol. 31, No. 8, Jan. 1898, "Thin film Module", W. T. Chen et al., pp. 135–138.

IBM TDB, vol. 33, No. 6B, Nov. 1990, "Electrical Performance Enhancement for Low-End Packaging", C. H. Snyder, pp. 228–232.

*Primary Examiner*—Kevin Picardat
*Attorney, Agent, or Firm*—Lawrence R. Fraley

[57] ABSTRACT

A semiconductor chip package and method of making same wherein the package comprises a ceramic substrate having two layers of thermally and electrically conductive material (e.g., copper) on opposing surfaces thereof, these layers thermally and electrically coupled by metal material located within holes provided in the ceramic. A semiconductor chip is mounted on one of these layers and the contact sites thereof electrically coupled to spaced circuitry which, in a preferred embodiment, is formed simultaneously with both thermally conductive layers. Coupling of the circuitry to an external substrate (e.g., printed circuit board) is preferably accomplished using metallic spring clips. These clips are preferably soldered in position. A preferred metal for being positioned within the hole(s) is solder, one example being 10:90 tin:lead solder. The package as produced herein may further include two quantities of a protective encapsulant material located substantially on the upper portions thereof to protect the chip and circuitry. The preferred means for coupling the chip to the circuitry is to use a wire bonding operation.

14 Claims, 2 Drawing Sheets

METHOD FOR MAKING A SEMICONDUCTOR CHIP PACKAGE WITH ENHANCED THERMAL CONDUCTIVITY

This is a divisional of application Ser. No. 08/336,437, filed Nov. 9, 1994, now U.S. Pat. No. 5,561,322.

TECHNICAL FIELD

The invention relates to semiconductor chip packages and particularly to those which utilize ceramic substrates having one or more chips mounted thereon. Even more particularly, the invention relates to such packages which are designed for being mounted on an external substrate (e.g., printed circuit board).

BACKGROUND OF THE INVENTION

Semiconductor chip packages which include one or more semiconductor chips mounted on a circuitized surface of a ceramic, e.g., alumina, substrate are known in the art. Typically, such a semiconductor chip package, conventionally termed a ceramic chip carrier, is mounted on a printed circuit card (or board). If surface mounting is to be used, the ceramic chip carrier may include a lead frame which is mechanically and electrically connected to electrical contact pads formed around the periphery of the chip-bearing, circuitized surface of the ceramic substrate.

Ceramic chip carriers of the type referred to above may include either single-layer and multi-layer ceramic substrates. In the former case, the chip carrier is fabricated by initially circuitizing an upper surface of the single ceramic layer using conventional thick film metal screening techniques. The metal employed is, for example, an alloy of silver (Ag) and palladium (Pd), which has a melting temperature of 1145 degrees C., and an electrical resistivity of $20 \times 10^{-8}$ ohm-meters. The resulting circuit lines typically have thicknesses and widths of, for example, 0.5 mils and 3 mils, respectively. After circuitization, the resulting ceramic layer is fired in air at a temperature of, for example, 850–950 degrees C., which is readily withstood by the Ag-Pd alloy. A semiconductor chip or chips is then mounted on the circuitized surface using conventional wire bonding techniques.

In the fabrication of a multi-layer ceramic substrate, each ceramic layer is usually circuitized using conventional thick film screening techniques, and these circuitized ceramic layers are then cured and laminated together at firing temperatures of, for example, 1900 degrees C. To withstand these high temperatures, the circuitry on each of the circuitized layers typically comprises a refractory metal such as molybdenum (Mo) or tungsten (W), which have melting temperatures equal to or greater than 2625 degrees C. and corresponding electrical resistivities equal to or greater than $5.2 \times 10^{-8}$ ohm-meters. As before, a chip (or chips) is conventionally mounted on the multilayer ceramic substrate using conventional wire bonding techniques.

One example of a ceramic chip carrier which may utilize either a lead frame or an edge clip for coupling the ceramic substrate's circuitry to an external substrate (e.g., circuit board) is defined in U.S. Pat. No. 5,243,133, issued to the same assignee as the present invention. As described therein, a cap (e.g., metal) serves to cover the positioned chip and protect portions of the circuitry. Remaining portions of the circuitry are protected by encapsulant.

Understandably, electronic packages of the type described hereinabove require effective heat removal in order to operate efficiently, the heat generated by the chip during package operation. Such a requirement becomes more significant when higher powered chips are utilized, as is the industry trend. One well known means of achieving chip heat removal is to use a heat sink, which may be directly coupled (e.g., by thermal adhesive) to the chip. In the case of the aforementioned U.S. Pat. No. 5,243,133, the metal cap may also serve as a heat sink.

In accordance with the teachings of the present invention, there is defined a new semiconductor chip package which includes effective heat removal, while also allowing for added operational capabilities if desired.

It is believed that such a package would constitute a significant advancement in the art.

OBJECTS AND SUMMARY OF THE INVENTION

It is, therefore, a principal object of the present invention to enhance the semiconductor chip packaging art by providing a package with enhanced thermal capabilities.

It is another object to provide such a package wherein enhanced operational capabilities are possible.

It is a further object to provide such a package which can be produced in a relatively inexpensive manner and is particularly adapted for mass production.

It is yet another object of the invention to provide a method for making such a package which can be accomplished in a facile manner.

These and other objects are attained in accordance with one embodiment of the invention wherein there is provided a semiconductor chip package comprising a ceramic substrate including first and second opposing surfaces and at least one hole extending through the substrate to interconnect the first and second opposing surfaces. A first thermally conductive layer is located on the first surface of said ceramic substrate and a second thermally conductive layer is located on the second surface of said substrate. A semiconductor chip is located on the first thermally conductive layer in a thermally coupled manner and a layer of circuitry is located on the first surface of the substrate at a predetermined distance from the first thermally conductive layer, the semiconductor chip being electrically coupled to the circuitry. At least one thermally conductive member is located within the hole of the substrate for thermally coupling the first and second thermally conductive layers such that heat generated by the semiconductor chip will pass from the first thermally conductive layer to the second thermally conductive layer. The invention further includes means for electrically coupling the layer of circuitry to an external substrate.

In accordance with another embodiment of the invention there is provided a method for making a semiconductor package which comprises the steps of providing a ceramic substrate having first and second opposing surfaces, providing at least one hole in the substrate to interconnect the first and second opposing surfaces, providing a thermally conductive member within the hole, providing first and second thermally conductive layers on the first and second opposing surfaces, respectively, the thermally conductive member in the hole thermally coupling the first and second thermally conductive layers, positioning a semiconductor chip on the first thermally conductive layer, providing a layer of circuitry on said first surface of the substrate at a spaced location from the first thermally conductive layer, electrically coupling the semiconductor chip to the layer of circuitry, and providing means for electrically coupling the layer of circuitry to an external substrate.

BEST MODE FOR CARRYING OUT THE INVENTION

For a better understanding of the present invention, together with other and further objects, advantages and capabilities thereof, reference is made to the following disclosure and the appended claims in connection with the above-described drawings.

Figure 1:
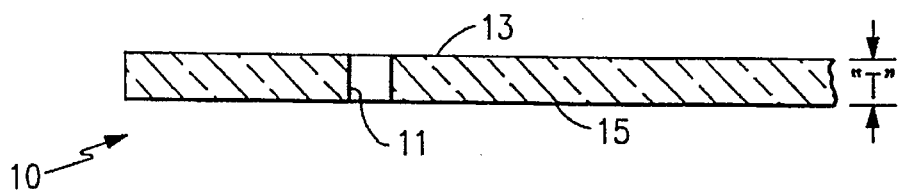
FIGS. 1–8 illustrate the various steps in producing a semiconductor chip package according to one embodiment of the invention, FIG. 8 being a partial view of the invention as completed and mounted on an underlying substrate (e.g., printed circuit board)

In FIG. 1 there is shown a ceramic substrate 10 in accordance with one embodiment of the invention. Substrate 10 includes at least one (and preferably several) holes 11 therein. In a preferred embodiment, a total of twelve holes 11 were provided (e.g., drilled) in a ceramic substrate of substantially rectangular configuration having four side walls each of the length of about 28 millimeters (mm). Substrate 10, if of such a rectangular configuration, includes a thickness (dimension "T" in FIG. 1) of about 0.6 min. Substrate 10 includes first and second opposing substantially planar surfaces 13 and 15, respectively. As indicated, substrate 10 is of ceramic material, a preferred example being alumina. Other materials are acceptable, including aluminum nitride.

Figure 2:
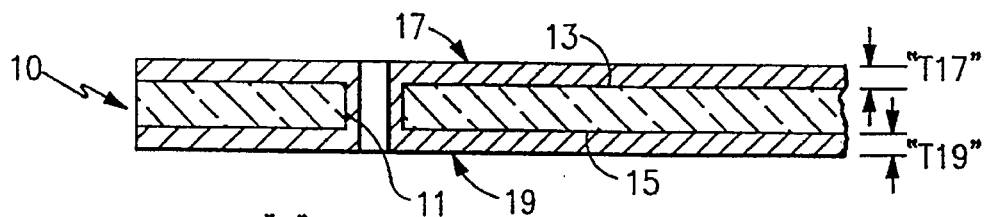

In FIG. 2, first and second thermally conductive layers 17 and 19 are shown as being applied to opposing planar surfaces 13 and 15, respectively. Preferably, both thermally conductive layers are provided substantially simultaneously using a sputtering operation. As is known, such a process involves the removal of atoms from a source by energetic ion bombardment, the ions supplied by a plasma. Sputtering operations of this type are known in the art and further description is not believed necessary. During the sputtering operation, an initial, very thin layer of chromium is deposited on the opposing substrate surfaces 13 and 15, following which a thicker layer of copper is applied, whereupon a final, very thin layer of chromium is added. In a preferred embodiment, the thicknesses for these metals were 0.1 µm, 8 µm, and 0.1 µm, respectively. In a third embodiment, the thickness ("T17") of first thermal layer 17 is about 8 µm and the corresponding thickness ("T19") of the bottom thermally conductive layer 19 is about 8 µm. In a preferred embodiment, the ratio of thickness of the first layer 17 to second layer 19 is within the range of from about 1:1 to about 1:10. Significantly, some of the material of layers 17 and 19 is deposited within hole 11. In the above example, the thickness of thermally conductive material within hole 11 was determined to be about 8 µm. In FIG. 2, it is noted that each of the metallic, thermally conductive layers 17 and 19 extend substantially to the outer peripheries (edges) of the underlying ceramic substrate 10.

In the next step for providing a semiconductor chip package in accordance with one embodiment of the invention, the metallic conductive layers 17 and 19 are subjected to a photolithography process wherein photoresist (not shown) is applied to both layers, in a substantially simultaneous fashion, and then exposed and developed to define the selected areas of layers 17 and 19 which are to remain in the final product. Such photolithography operations are well known in the printed circuit board and ceramic substrate manufacturing art and further description is not deemed necessary. Following photoresist development (removal), the desired areas of layers 17 and 19 remain protected while the non-developed resist has been removed to expose portions of these layers which are to be removed. An etching step, using ferric cloride and potassium permanganate as suitable etchants for chromium and copper as are commonly practiced in the industry, is next performed to remove the desired portions of layers 17 and 19.

Figure 3:
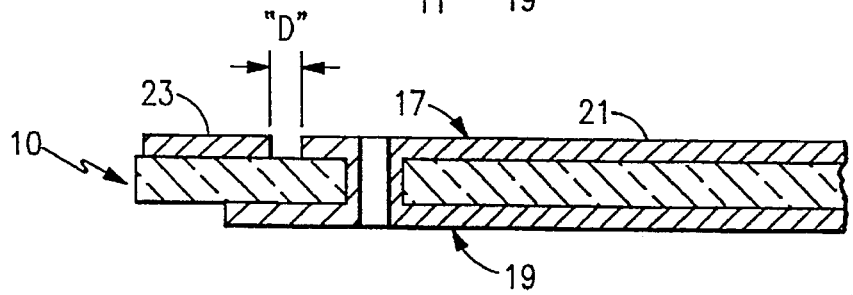

In FIG. 3, it is seen that at least two separate portions 21 and 23 remain from layer 17 while an edge portion of the bottom layer 19 (nearest the left edge of substrate 10) has been removed. Portion 23 preferably represents a layer of circuitry including, in one embodiment, several spaced copper lines for conducting signals from a semiconductor chip (described below) which is to eventually form part of the resulting package produced herein. Only one line is represented in FIG. 3 as forming a part of the spaced portion 23. Portion 23 is electrically isolated from the remaining larger portion 21. The bottom layer 19 is preferrably substantially solid throughout, comprising a solid layer of substantially rectangular shape. In one example, circuitry 23 is separated from the conductive portion 21 by a distance ("D") of about 0.25 mm.

Figure 4:
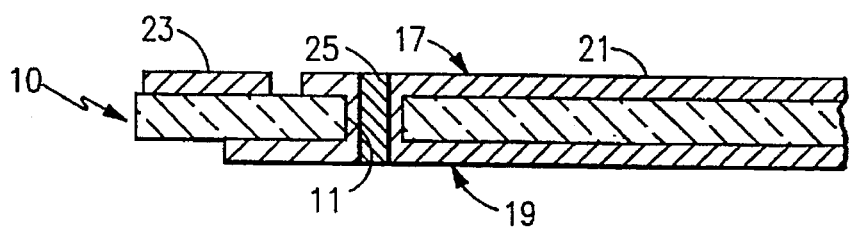

In FIG. 4, hole 11 is filled with a thermally conductive material 25. In a preferred embodiment, material 25 is solder and applied following the aforementioned sputtering operation which resulted in layers 17 and 19. One known soldering operation is a wave solder operation, although other types of soldering operations are useful to substantially fill hole 11 with this conductive metal. For example, individual solder elements (e.g., balls) can be positioned on the substrate surface relative to each of the holes 11 and reflowed to fill the holes. In an alternative embodiment, the material 25 positioned within hole 11 can be of another metal (e.g., copper) and may be inserted as a stud or the like within hole 11. A preferred solder is 10:90 tin:lead solder, a known material in the microelectronics field. Other solders, e.g., 15:85 or 20:80 tin:lead may also be used. In the broader aspects of the invention, it is even possible to significantly increase the thicknesses of the metal deposited within hole 11, e.g., by selective sputtering or electroplating, both using a mask. In such an embodiment, the preferred thickness of the metal on the internal walls of hole 11 is about 0.08 mm. As will be described below, the conductive material in hole 11 is primarily designed to permit heat transference from layer 17 to layer 19 during package operation. The material 25 must thus be of a thickness sufficient to allow this to occur. In one embodiment, the conductive layers 17 and 19 are coupled electrically, e.g., to provide a ground for the semiconductor chip (described below) if the chip is electrically coupled to layer 17 on which it is positioned.

Figure 5:
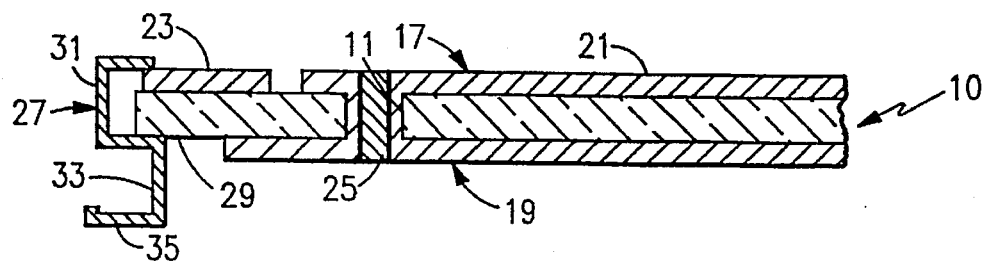
Figure 6:
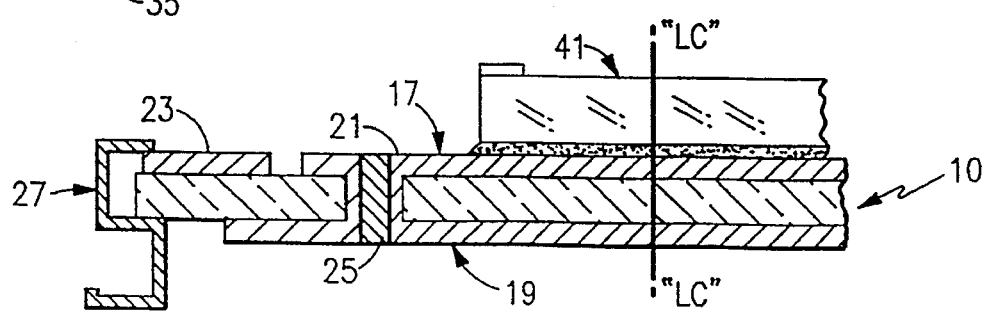

In FIG. 5, there is shown the provision of at least one metal clip 27 which, as seen, physically engages the upper surface of circuitry 23 and the exposed, under surface 29 of the ceramic substrate 10. Clip 27 is of spring-like material and preferably comprised of copper. Alternatives are copper alloys which include zirconium or iron, examples known in the industry under the designations CDA 151 and CDA 194. Clip 27 is of substantially S-shaped configuration and includes an upper C-shaped portion 31 which provides the above clamping engagement in the manner shown, and a second C-shaped portion 33 projecting below the under surface 29. Portion 33 includes a bottom leg segment 35 which is particularly designed for being positioned on a printed circuit board (below) and electrically connected to the circuitry thereon. In a preferred embodiment of the invention, a total of 208 clips 27 were utilized, these extending substantially about the entire outer periphery of the substrate 10 to provide coupling to respective portions of the circuitry 23 and respective circuit lines on the printed circuit board. Circuitry 23 may thus extend about the entire outer periphery along the upper surface of substrate 10 so that, if the embodiments shown in FIGS. 1–8 herein were extended further to the right, these would show a similar thickness and width layer of circuitry spaced from the common, internal portion 21. In such an arrangement, the bottom layer 19 would extend in a substantially similar manner, thereby exposing a portion of the under surface of the ceramic substrate, as occurred with position 29. The portion to the right of the center line ("LC") in FIG. 6 is preferably identical (and thus a mirror image of) the part of the invention as shown to the left of the center line. Further description and illustration is thus not deemed necessary.

In FIG. 6, a semiconductor chip 41 is shown as being mounted on the outer surface of layer 17, and particularly the substantially solid portion 21 thereof. A preferred material for accomplishing this is to utilize a thermally conductive adhesive, a preferred example being 965 IL epoxy available from Ablestick Laboratories of Rancho Dominguez, Calif. Preferably, this material is also electrically conductive in order to assure electrical grounding, should this feature be desired.

In FIGS. 6–9, chip 41 is shown with the surface having contact sites 43 thereon facing away from substrate 10 and particularly the underlying thermally conductive layer 21. Chip 41 is thus understood to be positioned in a "face up" orientation on substrate 10.

Figure 7:
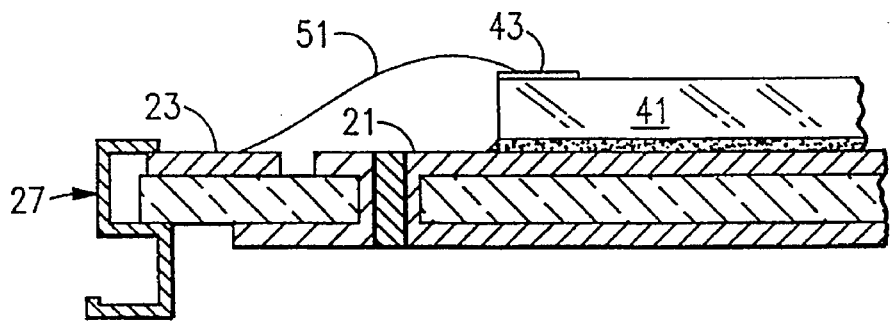

In FIG. 7, the contact sites (43) of chip 41 are electrically coupled to corresponding parts (e.g., pads) of the external circuitry 23. This preferred means for coupling is to use electrically conductive wires 51, attached to the sites 43 and circuitry 23 using a known wire bonding operation. During this known operation, the wires are bonded using heat and pressure. Because wire bonding is an operation well known in the art, further description is not believed necessary. In one example, a total of 208 wires 51 were utilized, each coupling a respective pair of contact sites 43 and portions (pads) of circuitry 23.

Given the dimensional constraints defined above, it is thus seen that the invention assures a highly dense product wherein several connections are accomplished in a minimum space.

Figure 8:
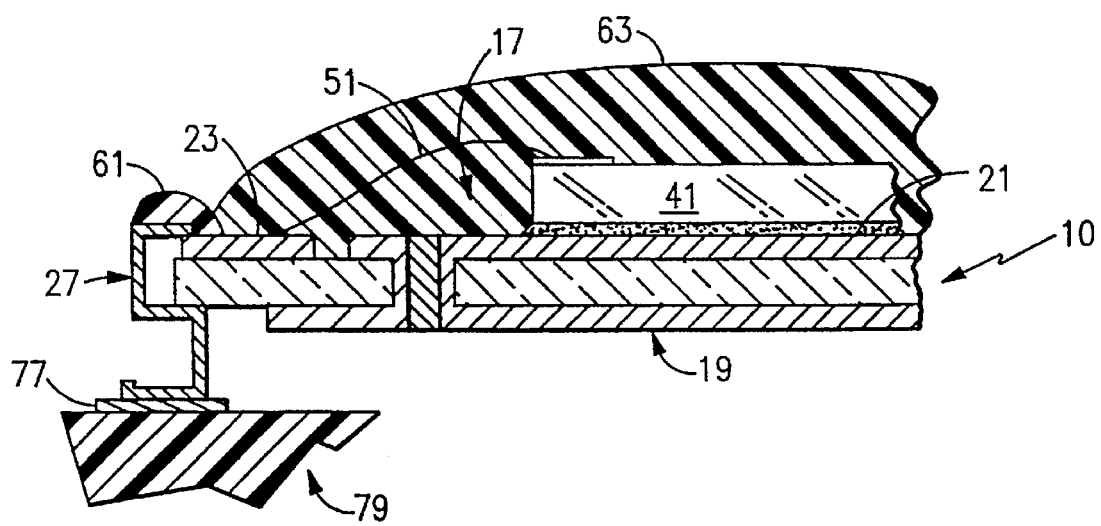

In FIG. 8, a first quantity of protectant (e.g., encapsulant) material 61 is shown as being applied to substantially cover the portions of clip 27 and the portions of circuitry 23 to which this clip is connected. In a preferred embodiment, the clip and circuitry and clip segments are coupled using solder. This is accomplished in one embodiment of the invention by applying a strip of spacedly positioned clips 27 onto the respective conductive portions of circuitry 23, solder having been applied to these portions beforehand. The structure is then heated to a sufficient temperature to effect solder reflow. The protective material 61 is then added. Following material 61, a much larger quantity of encapsulant material 63 is preferably applied to substantially cover chip 41, wires 51 and a significant part of circuitry 23. A preferred material for encapsulant 63 is Hysol FP4450 from the Dexter Electronic Materials Division, Dexter Corporation of Industry, Calif. (Hysol is a trademark of the Dexter Corporation.) In one example, approximately 0.5 grams of encapsulant 63 was applied. As further seen in FIG. 8, clip 27 is shown as being positioned on a corresponding pad 77 of the external substrate 79, which, as stated above, may comprise a printed circuit board. The invention is not limited, however, to positioning of packages as defined herein onto printed circuit boards as other substrates (including ceramic) may be readily used.

Figure 9:
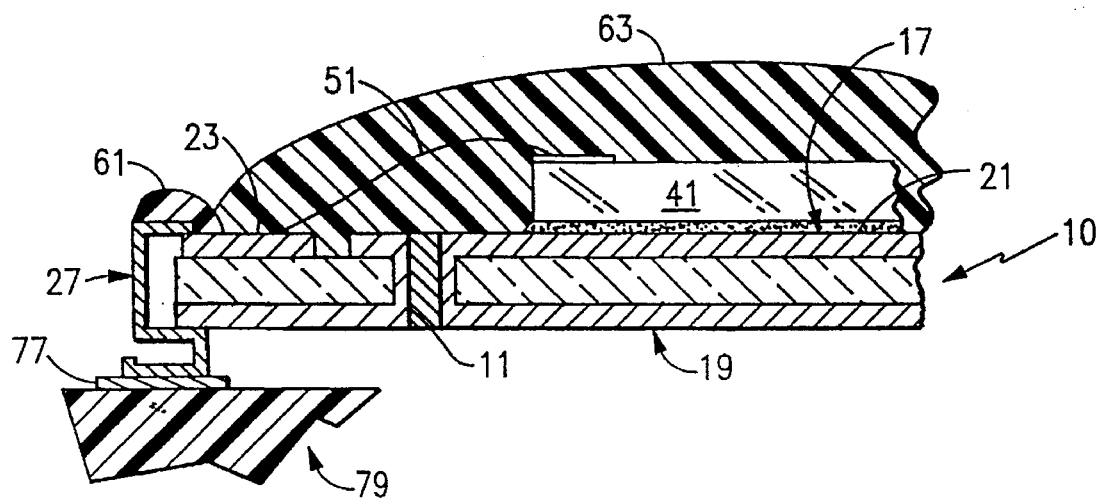
FIG. 9 is a partial, elevational view, in section, illustrating a chip package according to an alternative embodiment of the invention, said package shown mounted on an underlying substrate.

Should it be desirable to provide electrical grounding for chip 41, it is within the scope of the invention to electrically connect the ground contact sites of chip 41 with the underlying portion 21 of layer 17 (e.g., using wire bonding) such that portion 21 (and bottom layer 19) provide this capability. It is thus understood that portion 21 and layer 19 function as a ground plane for the invention in this format. Another means to utilize layer 19 as an active ground plane with respect to circuitry 23, the bottom layer 19 may be extended to substantially the outer edge of the ceramic substrate 10 as seen in FIG. 9. Clip 27 can then directly engage this underlying conductive layer 19 to ground corresponding pads or portions of the upper located circuitry 23 as desired. Extending layer 19 is relatively simple using the aforementioned photolithography operation.

Thus there has been shown and described a semiconductor chip package which provides for enhanced heat escape from the heat-generating chip which forms part of the package. The heat escape means illustrated herein is of relatively simple construction and can be provided in a relatively facile manner. As understood from the aforementioned, heat generated by the chip (41) passes through the thermally conductive adhesive bonding the chip to the underlying layer 17, whereupon said heat passes through the conductive metal within holes 11 and into layer 19, from which it may dissipate. As described, the bottom thermally conductive layer 19 may also function to serve as an electrically conductive ground plane and thus expand the capabilities of the invention. The invention is thus deemed to constitute a significant advancement in the art.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method for making a semiconductor chip package comprising the steps of:

providing a ceramic substrate having first and second opposing surfaces;

providing at least one hole in said substrate to interconnect said first and second opposing surfaces;

providing a thermally conductive member within said hole;

providing first and second thermally conductive layers on said first and second opposing surfaces, respectively, said thermally conductive member in said hole thermally coupling said first and second thermally conductive layers;

positioning a semiconductor chip having a first surface having a plurality of contact sites thereon on said first thermally conductive layer such that said first surface having said plurality of contact sites thereon faces away from said first thermally conductive layer and further such that said heat generated by said chip during package operation will pass from said first thermally conductive layer to said second thermally conductive layer through said thermally conductive member;

providing a layer of circuitry on said first surface of said substrate at a spaced and electrically isolated location from said first thermally conductive layer;

electrically coupling said contact sites of said semiconductor chip to said layer of circuitry; and providing means for electrically coupling said layer of circuitry to circuitry on an external circuitized substrate.

2. The method of claim 1 wherein said hole is provided in said ceramic substrate by drilling.

3. The method of claim 1 wherein said first and second thermally conductive layers are provided using a sputtering operation.

4. The method of claim 3 wherein said first and second thermally conductive layers are provided simultaneously.

5. The method of claim 4 wherein said layer of circuitry is applied substantially simultaneously with the provision of said first and second thermally conductive layers on said substrate.

6. The method of claim 1 wherein said layer of circuitry is applied using a photolithography operation.

7. The method of claim 6 wherein said photolithography operation comprises the steps of applying an electrically conductive layer on said first surface, applying, exposing and developing a photoresist on said electrically conductive layer, and etching selected portions of said conductive layer.

8. The method of claim 7 wherein said steps of said photolithography operations are further used to provide said first and second thermally conductive layers substantially simultaneously with the application of said layer of circuitry.

9. The method of claim 1 wherein said chip sites are electrically coupled to said layer of circuitry using a wire-bonding operation.

10. The method of claim 1 wherein said thermally conductive member is provided within said hole of said ceramic using a soldering operation.

11. The method of claim 1 further including the step of applying a protective encapsulant over said semiconductor chip.

12. The method of claim 10 wherein said soldering operation comprises positioning a solder ball on said substrate relative to said at least one hole and thereafter reflowing said solder ball such that said solder ball will fill said at least one hole.

13. The method of claim 1 wherein said providing of said means for electrically coupling said layer of circuitry to said circuitry on said external circuitized substrate comprises the step of positioning a metal member on the external periphery of said substrate.

14. The method of claim 13 further including the step of extending said layer of circuitry on said first surface of said substrate to said esternal periphery of said substrate and thereafter directly contacting said layer of circuitry with said metal member.

* * * * *